(12) United States Patent
Lachaud et al.

(10) Patent No.: US 8,036,012 B2
(45) Date of Patent: Oct. 11, 2011

(54) DEVICE FOR CONTROLLING THE ACTIVITY OF MODULES OF AN ARRAY OF MEMORY MODULES

(75) Inventors: Claire-Marie Lachaud, Grenoble (FR); Christophe Goncalves, Puyloubier (FR)

(73) Assignees: STMicroelectronics (Crolles 2) SAS, Crolles (FR); STMicroelectronics (Rousset) SAS, Rousset (FR)

( * ) Notice: Subject to any disclaimer, the term of this patent is extended or adjusted under 35 U.S.C. 154(b) by 142 days.

(21) Appl. No.: 12/619,380

(22) Filed: Nov. 16, 2009

(65) Prior Publication Data

US 2010/0124100 A1    May 20, 2010

(30) Foreign Application Priority Data

Nov. 17, 2008  (FR) ...................................... 08 57807

(51) Int. Cl.
*G11C 11/00* (2006.01)
*G11C 5/00* (2006.01)
*G06F 12/06* (2006.01)
*G06F 13/00* (2006.01)

(52) U.S. Cl. ................. 365/63; 365/52; 711/5; 711/103

(58) Field of Classification Search ....................... 365/63
See application file for complete search history.

(56) References Cited

U.S. PATENT DOCUMENTS

| | | | | |
|---|---|---|---|---|
| 4,342,079 A * | 7/1982 | Stewart et al. | ...................... | 711/5 |
| 4,716,308 A * | 12/1987 | Matsuo et al. | ................. | 326/121 |
| 5,513,138 A * | 4/1996 | Manabe et al. | .......... | 365/185.33 |
| 5,648,929 A | 7/1997 | Miyamoto | ............... | 365/185.04 |
| 5,822,251 A * | 10/1998 | Bruce et al. | .............. | 365/185.33 |
| 6,388,473 B1 * | 5/2002 | Nakaizumi | .................... | 326/110 |
| 6,680,858 B2 * | 1/2004 | Nakamura et al. | .............. | 365/63 |
| 6,888,733 B2 * | 5/2005 | Jang et al. | ......................... | 365/51 |
| 6,968,419 B1 * | 11/2005 | Holman | ............................... | 711/5 |
| 7,483,331 B2 * | 1/2009 | Uchida | .................... | 365/230.03 |
| 2005/0114587 A1 | 5/2005 | Chou et al. | .................... | 711/103 |
| 2007/0152714 A1 | 7/2007 | Wu | ................................ | 326/113 |
| 2009/0037784 A1 * | 2/2009 | Kim et al. | ..................... | 714/719 |
| 2010/0328983 A1 * | 12/2010 | Cheng | ............................ | 365/51 |

* cited by examiner

*Primary Examiner* — Son Mai
(74) *Attorney, Agent, or Firm* — Lisa K. Jorgenson; Allen, Dyer, Doppelt, Milbrath & Gilchrist, P.A.

(57) ABSTRACT

A memory device includes an array of memory modules, a global controller, and a local controller for each memory module in the array of memory modules being configured to deliver to the global controller an activity signal reflecting an activity of the respective memory module. The memory device includes a circuit configured to implement a NAND logic function based upon the activity signals and to output a control signal to the global controller based upon the NAND logic function.

29 Claims, 5 Drawing Sheets

DEVICE FOR CONTROLLING THE ACTIVITY OF MODULES OF AN ARRAY OF MEMORY MODULES

FIELD OF THE INVENTION

The present invention relates, generally, to memory controllers, and more particularly to memory modules, notably of the dynamic or static random access memory (DRAM or SRAM) type, and to those memory architectures that include an array of such modules.

BACKGROUND OF THE INVENTION

Typically, such memory arrays comprise memory modules arranged in a repetitive manner. For example, for a 4-Mbit embedded DRAM-type memory, thirty-two 128-Kbit modules are associated. Each memory module generally includes a local controller, which communicates with an overall activity controller. The overall activity controller is used to monitor the activity of each module based on information supplied by each local controller, in order to launch an operation for any one of the modules only when all the modules are inactive.

In other words, when one or more of the memory modules has begun an operation, the overall activity controller waits for completion of the operation before beginning an operation for one of the other modules. The memory may therefore wait for the last module activated, or the slowest, to have completed its operation before activating another module. To implement this control, each local controller is connected to a common bus, to which the overall activity controller is also connected to.

Typically, each local controller includes a 3-state buffer circuit receiving, as input, an activity signal obtained from the memory module and delivering to the control bus a control signal, the level of which reflects the activity of the module being monitored. When the memory module is inactive, the control bus is set to high impedance. A new activity is ready to be launched when all the memory modules are inactive. At the start of activity, the control signal is set to "0", whereas at the end of activity, the control signal is set to "1".

This type of control is largely dependent on the size of the memory array, such that, when the size of the memory increases, the performance falls. In practice, when the size of the memory increases, the buffer circuits may be dimensioned accordingly, which means a consecutive dimensioning of the control bus so that it is difficult to reach the target speed.

Moreover, when a memory module is situated at a great distance from the overall activity controller, the resistive effect in the control bus further reduces the speed of the memory so that, before activating a module of the memory array, the overall activity controller may often wait for the module situated furthest away, which is not necessarily the slowest, to indicate an end of its activity. It has also been observed that the complexity of the controller increases exponentially with gains in performance.

SUMMARY OF THE INVENTION

An object is to provide a device for controlling the activity of memory modules of an array of memory modules that makes it possible to improve the speed of the memory and also makes it possible to reduce the complexity of the controllers involved in its construction.

According to a first aspect, a device for controlling the activity of memory modules of an array of memory modules may comprise an overall activity controller and, for each module, a local controller delivering to the overall activity controller a control signal reflecting the activity of the module. According to a general characteristic of this device, the device may comprise a circuit for implementing a NAND logic function on an activity signal delivered by the memory module, and delivering the control signal as an output.

According to another characteristic of this device, the circuit may comprise a first transistor with a first type of conductivity, and a second transistor with a second type of conductivity, each having a control electrode receiving the activity signal. The first transistors of the set of memory modules may be connected in series between the ground and the overall activity controller, each second transistor being connected between a voltage source and the overall activity controller.

According to yet another characteristic of the control device, the first transistor may be an N-type metal oxide semiconductor (MOS) transistor, and the second transistor may be a P-type MOS transistor. For example, the first transistor may be low voltage threshold (LVT) type NMOS transistor, and the second transistor may be a standard/high voltage threshold (SVT- or HVT)-type PMOS transistor. In one embodiment, the circuit may comprise a third transistor with the second type of conductivity connected in parallel to the first transistor. This third transistor can be a PLVT-type PMOS transistor. The third transistor may comprise a control electrode receiving the complement of the activity signal.

According to this device, the circuit can comprise a fourth transistor with the second type of conductivity and may have a control electrode connected to the control electrode of the first transistor, a first electrode connected to a voltage source, and a second electrode connected to one of the electrodes of the first transistor. For example, the fourth transistor may be an HVT-type PMOS transistor.

According to another aspect, a RAM memory circuit may comprise a device as defined hereinabove. According to yet another aspect, electronic equipment may include a RAM memory circuit as defined hereinabove.

BRIEF DESCRIPTION OF THE DRAWINGS

Other aims, characteristics, and benefits of the device may become apparent from reading the following description, given purely by way of nonlimiting example, and with reference to the appended drawings, in which.

DETAILED DESCRIPTION OF THE PREFERRED EMBODIMENTS

Figure 1:
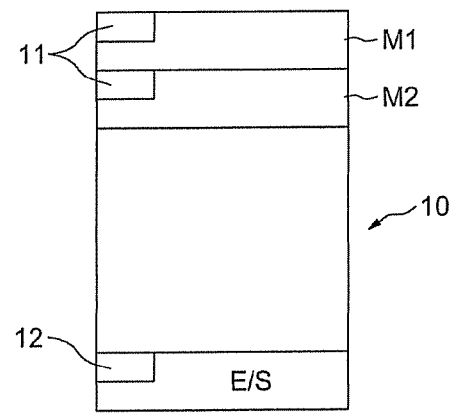
FIG. 1 illustrates the architecture of a RAM memory array provided with an activity control device, according to the present invention.

FIG. 1 shows the general architecture of an array of RAM memory modules, notably of the DRAM or SRAM type, designated by the general numeric reference 10. However, it may be noted that there is no departure from the framework of the present description when it is applied to any type of memory device of RAM, read only memory (ROM) type, notably electronically erasable programmable ROM (EEPROM), etc. For example, this array has a capacity of 4 Mbits and comprises a set of planes or memory modules, such as M1 and M2, and an input-output interface I/O.

The memory array can, for example, be involved in constructing various types of electronic equipment, such as a hard disk controller, or consumer electronic equipment, such as a printer, a mobile phone, etc. In order to control the activity of each module, the array 10 includes a distributed control device comprising, for each module, a local controller 11 and an overall activity controller 12, which receives a control signal from the local controllers.

It may be noted that the number of memory modules involved in constructing the array depends on the overall activity capacity of the memory used, and that of each module. It may, however, be considered, hereinafter in the description, that the array comprises four memory modules that can be accessed in parallel for storing data.

Figure 2:
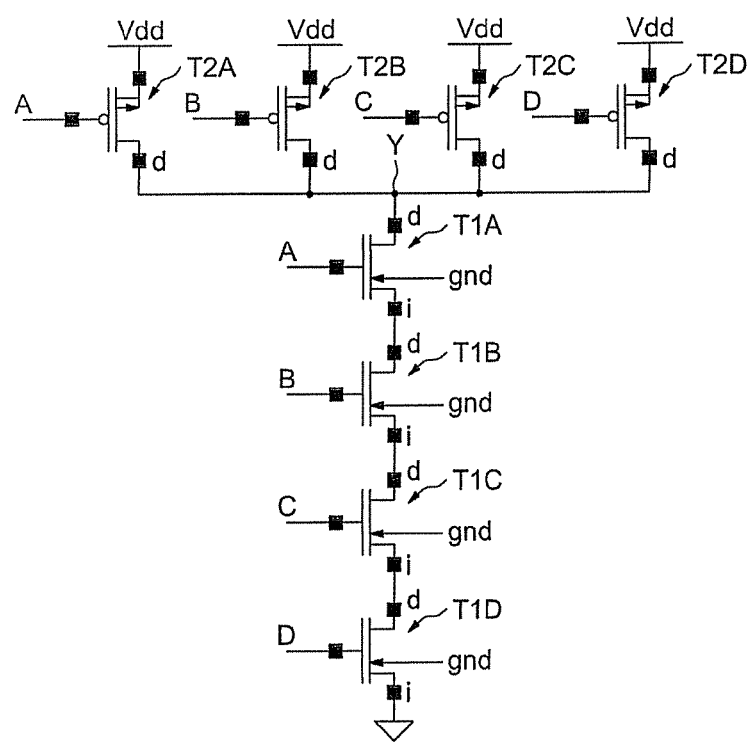
FIG. 2 illustrates the architecture of a control device in one embodiment, according to the present invention.

Referring to FIG. 2, each control module, of which there are four in this case, is based on the implementation of a circuit forming a logic gate implementing a NAND function on an activity signal delivered by each memory module. This circuit is designed to perform a NAND logic function between the memory module and the overall activity controller. Thus, there is no departure from the framework of the present disclosure when the circuit implements an AND logic function, the NOT function then being incorporated in the overall activity controller.

To implement the function and transmit to the overall activity controller information reflecting the activity of the set of memory modules, a logic gate is constructed between the modules, instead of the assembly comprising the buffer circuit and the control bus, to supply the control signal to the overall activity controller. In other words, the device receives all the activity signals from the memory modules and globally implements a NAND logic function on these activity signals by combining these signals into a single output, which makes it possible to determine if at least one of the memory modules is active.

Thus, by referring to FIG. 2, which corresponds to a RAM memory architecture comprising four memory modules and in which the references A, B, C and D relate respectively to the four memory modules, the circuit comprises a first N-type transistor, respectively T1A, T1B, T1C and T1D, and a second p-type transistor, respectively T2A, T2B, T2C and T2D. The gate of each of the first and second transistors receives an activity signal A, B, C, D from one of the memory modules (not shown).

Furthermore, the first transistors T1A, T1B, T1C and T1D are connected in series between the ground and the overall activity controller 12, at the node Y. The drain of the first transistor T1A is thus connected to the node Y and its source is connected to the drain of the first transistor T1B of a second memory module B. The source of this transistor T1B is connected to the drain of the first transistor T1C of a third memory module, the source of which is connected to the drain of the first transistor T1D of a fourth memory module. The source of the first transistor T1D is connected to the ground. Regarding the second transistors, their source nodes are connected to a DC voltage, for example, vdd, and their drain is connected to the node Y.

As indicated previously, a high level for one of the activation signals A, B, C, or D corresponds to an inactivity of the corresponding memory module, so that, if all the activity signals A, B, C, and D are at the high level, the overall activity controller can activate at least one of the memory modules. In other words, in this case, the node Y is set to "0" thanks to the first transistors T1A, T1B, T1C, and T1D.

If at least one of the memory modules is active, for example, the first module A, the second transistor T2A is in the conducting state and the node Y is set to "1." This information is recovered by the overall activity controller, which then sends no requests toward any one of the memory modules as long as the activity signal A is not at "1." Thus, by default, the node Y is at "0" and, if at least one activity signal is at "0", the value of this node Y changes to "1."

It is thus possible, thanks to the use of two MOS transistors, for each memory module, jointly implementing, for all the memory modules, a NAND logic function between the activity signals, to supply a control signal to the overall activity controller, and to do so in a relatively simple arrangement. It may be noted that, advantageously, the first transistors comprise low voltage threshold (LVT) type NMOS transistors, in order to produce transistors that switch very rapidly, whereas the second transistors comprise standard voltage threshold (SVT) type PMOS transistors. These transistors make it possible to improve the behavior of the NMOS transistors in series and the PMOS transistors. In practice, the LVT transistors offer the benefit of switching rapidly, although they are likely to generate relatively high leak currents. The HVT-type transistors are slower, but generate less in the way of leak currents, the SVT-type transistors having intermediate speed and leak characteristics.

Thus, in the context of the present control device, the use of an LVT transistor to produce the first transistors makes it possible to obtain a high switching speed, the leaks associated with the use of this type of transistor not generating major drawbacks in as much as, by default, in the absence of activity. These transistors conduct and when active, the leaks originate from the second transistors, which generate little in the way of leaks. However, for low-power applications, the PMOS transistors can be of the high voltage threshold (HVT) MOS type in order to further reduce the leaks.

Figure 3:
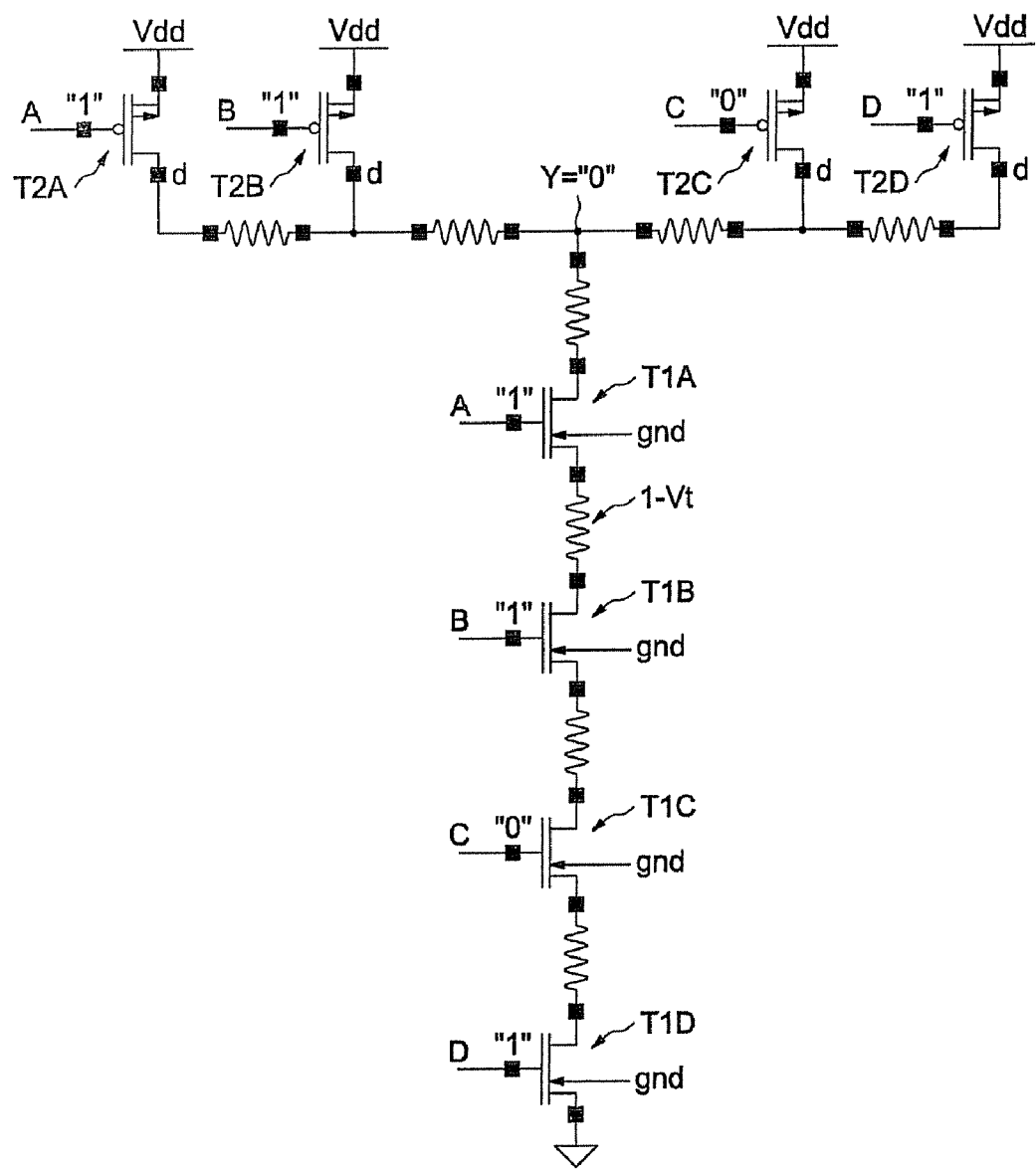
FIG. 3 shows the spurious resistances of the circuit of FIG. 2.

Now referring to FIG. 3, it may be noted that, in practice, the presence of spurious resistances such as r are observed, due to the propagation between the memory modules. Thus, for example, when the module C is active (activation signal C at "0"), the node Y is set to "1" due to the conducting state of the second transistor T2C. However, in this case, the common node between the first transistor T1A and the second transistor T1B of an adjacent memory module is set at a value close to "1" or, in practice, $1-V_t$, $V_t$ denoting the threshold voltage of the transistor.

The common node between the source of this transistor T1B and the drain of the transistor T1C of an adjacent module is also set at a level $1-V_t$. Ideally, the common nodes between the transistors T1A and T1B, on the one hand, and between the transistors T1B and T1C, on the other hand, should be set to vdd when the memory module C is activated, in order to obtain the same behavior when any one of the modules is activated.

Figure 4:
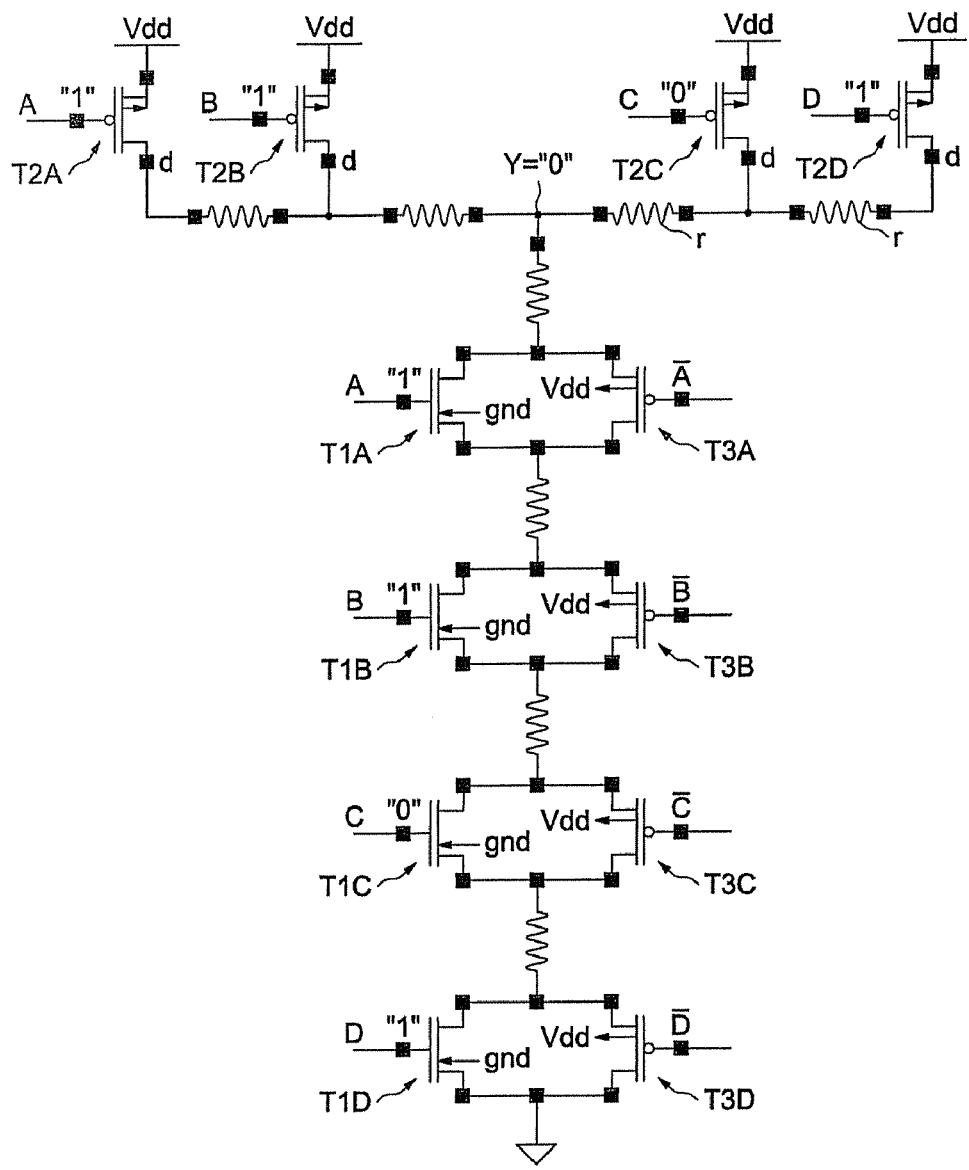
FIG. 4 illustrates another exemplary embodiment of a control device, according to the present invention.

For this reason, according to another embodiment illustrated in FIG. 4, a third p-type MOS transistor, respectively T3A, T3B, T3C and T3D, is connected in parallel to the first transistor T1A, T1B, T1C and T1D, respectively, so that, for example, regarding the third transistor T3A of one of the memory modules, its source is connected to the drain of the first transistor T1A whereas its drain is connected to the source of the first transistor T1A. The gate of each of the third transistors T3A, T3B, T3C and T3d receives the complement $\overline{A}$ of the activation signal of the corresponding module.

For example, as indicated previously, when the module C is activated, the activation signal C is set at "0" so that the node Y is set at "1." In this case, the common node between the transistors T1A and T1B, on the one hand, and T1B and T1C, on the other hand, is set at "1" thanks to the conductive state of the PMOS transistors, the limitation due to the NMOS transistors then being eliminated. For example, the third transistor is an LVT-type PMOS transistor. As can be seen, when idle, this transistor is conductive and induces no consumption. The consumption is then generated by the second transistors which, as indicated previously, generate less in the way of leaks.

In order to further improve the speed of the device and eliminate more of the effects associated with the spurious resistances, a fourth PMOS transistor T4A, T4B, T4C and T4D is associated with each memory module, for example, an HVT-type PMOS transistor. The use of an HVT-type transistor, which generates little in the way of leaks, is advantageous here for producing this fourth transistor since this transistor is not conductive by default.

Figure 5:
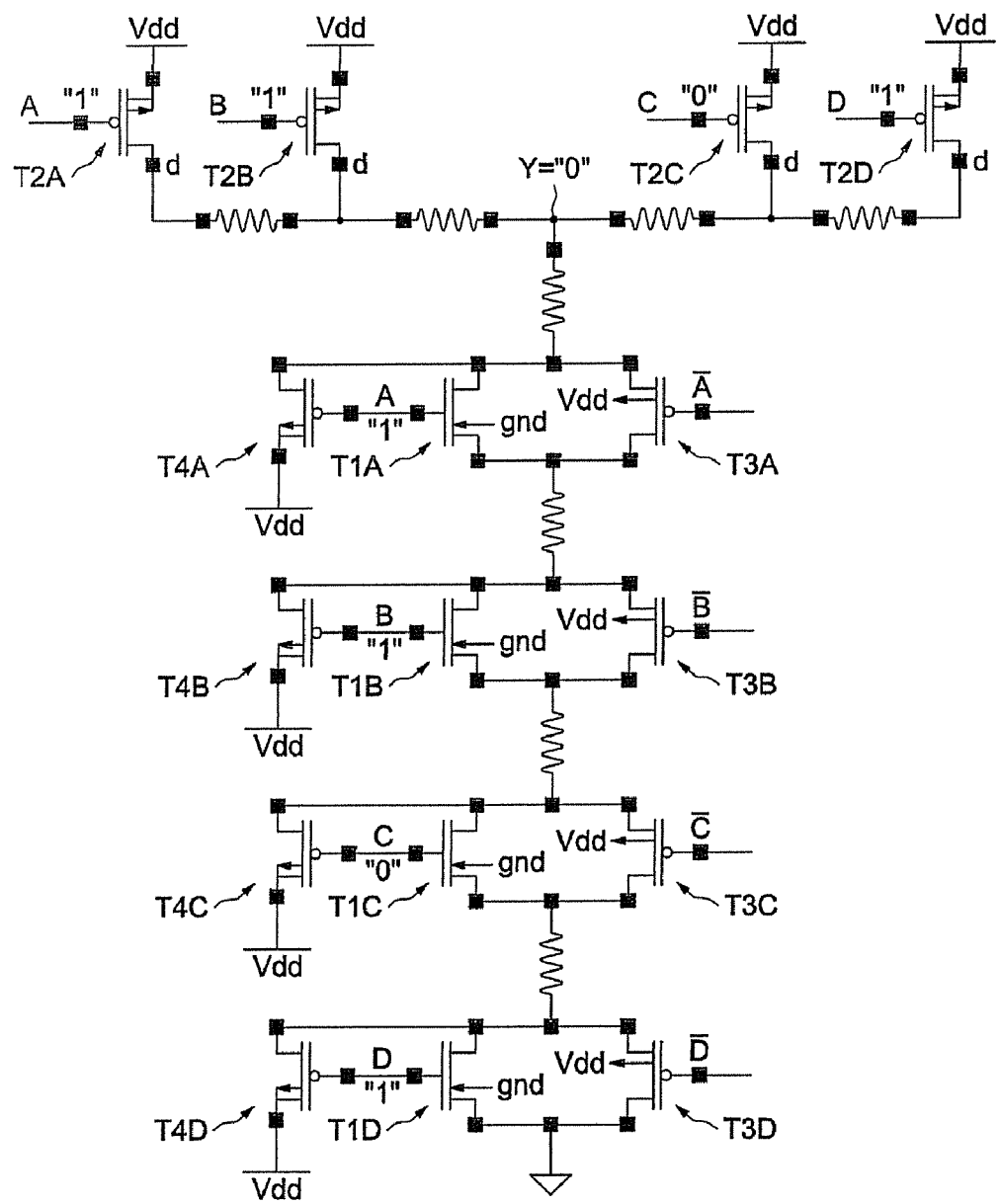
FIG. 5 illustrates yet another exemplary embodiment of a control device, according to the present invention.

As can be seen in FIG. 5, which illustrates an exemplary embodiment of such a device, the gate of each of these fourth transistors is connected to the gate of the corresponding first transistor T1A, T1B, T1C or T1D, so as to receive the activation signal A, B, C, or D. The drain of this fourth transistor is connected to the drain of the corresponding first transistor, its source being connected to a DC power source vdd. This fourth transistor can be used to speed up the return to the high level of the nodes situated between the first transistors.

In practice, for example, in the case where the third memory module C is active (activation signal C at "0"), the node Y is at "1." The common node between the first transistors T1A and T1B is at "1," and the common node between the first transistor T1B and the first transistor T1C is at "1." The common node between the first transistor T1C and the first transistor T1D is at "0."

The setting to "1" of the nodes between the first transistors is accelerated thanks to the presence of the fourth MOS transistors, which set the nodes at "1" immediately when the corresponding activation signal is at "0." Thus, in the example described, the node between the transistors T1B and T1C is more rapidly set at "1." Such is also the case of the node between the transistors T1A and T1B. It can therefore be seen that this embodiment is advantageous in as much as it makes it possible to achieve the objectives targeted by the control device.

Figure 6:
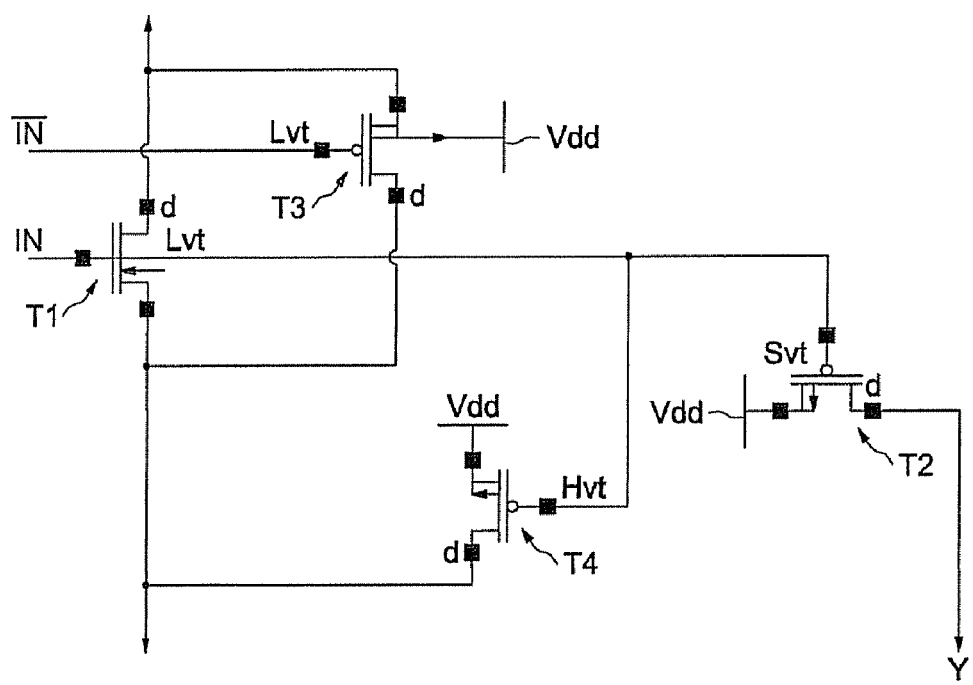
FIG. 6 illustrates the architecture of an individual cell of the device of FIG. 5.

Thus, referring to FIG. 6, according to this advantageous embodiment, each cell of the control device comprises a first NMOS transistor T1 and a second PMOS transistor T2, the gate of which receives an activity signal IN originating from a memory module with which it is associated, which jointly constitute the base of the control cell. As indicated previously, the first transistor T1 is an LVT-type transistor, whereas the second transistor T2 is an SVT- or HVT-type transistor, for low-power applications. However, it may be noted that there is no departure from the framework of the present description when transistors of another type are used. For example, the transistors can be of the same type, for example, all SVT or all HVT.

The drain and the source of the first transistor T1 are respectively connected to the first transistors of an adjacent control cell or, where appropriate, either to the node Y, or to ground, depending on the positioning of the cell with respect to the other cells of the control device. Regarding the second transistor T2, its drain is connected to the node Y, whereas its source is connected to a power supply voltage source.

As can be seen, the cell further comprises a third LVT-type PMOS transistor T3, the drain of which is connected to the source of the first transistor T1 and the source of which is connected to the drain of this first transistor T1. The gate of the transistor T3 receives the complement $\overline{IN}$ of the activity signal.

The cell further comprises a fourth HVT-type PMOS transistor T4, the gate of which is connected to the gate of the first and second transistors T2 and thus receives the activity IN signal, the drain of which is connected to the source of the first transistor T1 and the source of which is connected to the power supply source. It may finally be noted that, in the embodiments considered, it is advantageously possible to use several sets of control modules. Thus, for example, it is possible, in various embodiments, to provide for combining four groups of control modules, each monitoring eight memory modules, in particular for a 4 megabit memory.

That which is claimed:

1. A memory device comprising:
   an array of memory modules;
   a global controller;
   a local controller for each memory module in said array of memory modules configured to deliver to said global controller an activity signal reflecting an activity of the respective memory module; and
   a circuit configured to implement a NAND logic function based upon the activity signals and to output a control signal to said global controller based upon the NAND logic function.

2. The memory device according to claim 1 wherein said circuit comprises:
   a plurality of first transistors of a first type of conductivity, each transistor having a control electrode receiving the activity signal from the respective memory module; and
   a plurality of second transistors of a second type of conductivity, each transistor having a control electrode receiving the activity signal from the respective memory module;
   said plurality of first transistors to be coupled in series between a first reference voltage and said global controller;
   said plurality of second transistors to be coupled between a second reference voltage and said global controller.

3. The memory device according to claim 2 wherein each first transistor is a N-type metal oxide semi-conductor (MOS) transistor; and wherein each second transistor is a P-type MOS transistor.

4. The memory device according to claim 3 wherein each first transistor is a low voltage threshold (LVT)-type NMOS transistor; and wherein each second transistor is a high voltage threshold (HVT)-type PMOS transistor.

5. The memory device according to claim 2 wherein said circuit further comprises a plurality of third transistors of the second type of conductivity to be coupled in parallel to the said plurality of first transistors.

6. The memory device according to claim 5 wherein each third transistor is an LVT-type PMOS transistor.

7. The memory device according to claim 5 wherein each third transistor has a control electrode receiving a complement of the activity signal from the respective memory module.

8. The memory device according to claim 2 wherein said circuit comprises a plurality of fourth transistors of the second type of conductivity, each fourth transistor including:
   a control electrode to be coupled to the control electrode of the corresponding first transistor;
   a first conducting electrode to be coupled to the second reference voltage; and
   a second conducting electrode to be coupled to a conducting electrode of the corresponding first transistor.

9. The memory device according to claim 8 wherein each fourth transistor is an HVT-type PMOS transistor.

10. The memory device according to claim 1 wherein the array of memory modules comprises an array of random access memory (RAM) memory modules.

11. The memory device according to claim 1 wherein the array of memory modules comprises an array of read only memory (ROM) memory modules.

12. A memory device comprising:
    an array of memory modules;
    a global controller;
    a local controller for each memory module in said array of memory modules configured to deliver to said global controller an activity signal reflecting an activity of the respective memory module; and a circuit configured to implement an AND logic function based upon the activity signals and to output a control signal to said global controller based upon the AND logic function.

13. The memory device according to claim 12 wherein said circuit comprises:
a plurality of first transistors of a first type of conductivity, each transistor having a control electrode receiving the activity signal from the respective memory module; and
a plurality of second transistors of a second type of conductivity, each transistor having a control electrode receiving the activity signal from the respective memory module;
said plurality of first transistors to be coupled in series between a first reference voltage and said global controller;
said plurality of second transistors to be coupled between a second reference voltage and said global controller.

14. The memory device according to claim 13 wherein each first transistor is an N-type metal oxide semi-conductor (MOS) transistor; and wherein each second transistor is a P-type MOS transistor.

15. The memory device according to claim 14 wherein each first transistor is a low voltage threshold (LVT)-type NMOS transistor; and wherein each second transistor is a high voltage threshold (HVT)-type PMOS transistor.

16. The memory device according to claim 13 wherein said circuit further comprises a plurality of third transistors of the second type of conductivity to be coupled in parallel to the said plurality of first transistors.

17. The memory device according to claim 16 wherein each third transistor is an LVT-type PMOS transistor.

18. The memory device according to claim 16 wherein each third transistor has a control electrode receiving a complement of the activity signal from the respective memory module.

19. The memory device according to claim 13 wherein said circuit comprises a plurality of fourth transistors of the second type of conductivity, each fourth transistor including:
a control electrode to be coupled to the control electrode of the corresponding first transistor;
a first conducting electrode to be coupled to the second reference voltage; and
a second conducting electrode to be coupled to a conducting electrode of the corresponding first transistor.

20. A method of making a memory device for controlling an array of memory modules comprising:
configuring a local controller for each memory module in the array of memory modules to deliver to a global controller an activity signal reflecting an activity of the respective memory module; and
coupling a circuit configured to implement a NAND logic function based upon the activity signals and to output a control signal to the global controller based upon the NAND logic function.

21. The method according to claim 20 wherein the circuit comprises:
a plurality of first transistors of a first type of conductivity, each transistor having a control electrode receiving the activity signal from the respective memory module; and
a plurality of second transistors of a second type of conductivity, each transistor having a control electrode receiving the activity signal from the respective memory module;
the plurality of first transistors to be coupled in series between a first reference voltage and the global controller;
the plurality of second transistors to be coupled between a second reference voltage and the global controller.

22. The method according to claim 21 wherein the circuit further comprises a plurality of third transistors of the second type of conductivity to be coupled in parallel to the plurality of first transistors.

23. The method according to claim 22 wherein each third transistor has a control electrode receiving a complement of the activity signal from the respective memory module.

24. The method according to claim 21 wherein the circuit comprises a plurality of fourth transistors of the second type of conductivity, each fourth transistor including:
a control electrode to be coupled to the control electrode of the corresponding first transistor; and
a first conducting electrode to be coupled to the second reference voltage; and
a second conducting electrode to be coupled to a conducting electrode of the corresponding first transistor.

25. A method of making a memory device for controlling an array of memory modules comprising:
configuring a local controller for each memory module in the array of memory modules to deliver to a global controller an activity signal reflecting an activity of the respective memory module; and
coupling a circuit configured to implement an AND logic function based upon the activity signals and to output a control signal to the global controller based upon the AND logic function.

26. The method according to claim 25 wherein the circuit comprises:
a plurality of first transistors of a first type of conductivity, each transistor having a control electrode receiving the activity signal from the respective memory module; and
a plurality of second transistors of a second type of conductivity, each transistor having a control electrode receiving the activity signal from the respective memory module;
the plurality of first transistors to be coupled in series between a first reference voltage and the global controller;
the plurality of second transistors to be coupled between a second reference voltage and the global controller.

27. The method according to claim 26 wherein the circuit further comprises a plurality of third transistors of the second type of conductivity to be coupled in parallel to the plurality of first transistors.

28. The method according to claim 27 wherein each third transistor has a control electrode receiving a complement of the activity signal from the respective memory module.

29. The method according to claim 26 wherein the circuit comprises a plurality of fourth transistors of the second type of conductivity, each fourth transistor including:
a control electrode to be coupled to the control electrode of the corresponding first transistor; and
a first conducting electrode to be coupled to the second reference voltage; and
a second conducting electrode to be coupled to a conducting electrode of the corresponding first transistor.

* * * * *